United States Patent [19]
Higuchi

[11] 3,970,949
[45] July 20, 1976

[54] HIGH-FREQUENCY AUTOMATIC GAIN CONTROL CIRCUIT

[75] Inventor: Michio Higuchi, Tokyo, Japan

[73] Assignee: Oki Electric Industry Company, Ltd., Tokyo, Japan

[22] Filed: Nov. 19, 1974

[21] Appl. No.: 525,189

[30] Foreign Application Priority Data
Nov. 21, 1973 Japan............................. 48-130175

[52] U.S. Cl.................................. 330/29; 330/28; 330/110
[51] Int. Cl.² ......................................... H03G 3/30
[58] Field of Search ................ 330/28, 29, 110, 145

[56] References Cited
UNITED STATES PATENTS 3,624,561  11/1971  Tongue........................... 330/145 X
3,731,216  5/1973  Nakamura........................... 330/29

Primary Examiner—R. V. Rolinec
Assistant Examiner—Lawrence J. Dahl
Attorney, Agent, or Firm—Kenyon & Kenyon

[57] ABSTRACT

A high-frequency automatic gain control circuit for a common emitter earthed amplifier wherein a hybrid negative feedback is applied to an input stage thereof from the emitter of an output stage transistor through a hybrid transformer connected to the base of an input stage transistor and a series negative feedback is applied to the output stage thereof, and according to the present invention a diode which is shunted by a capacitor is connected in series to an emitter resistor of the output stage transistor, and an automatic gain control signal is applied to said diode for regulating the gain of said amplifier by controlling negative feedback ratio of said negative feedback.

3 Claims, 5 Drawing Figures

HIGH-FREQUENCY AUTOMATIC GAIN CONTROL CIRCUIT

BACKGROUND OF THE INVENTION

This invention relates to an automatic gain control (to be referred to as "AGC", hereinafter) circuit for a high-frequency range which includes VHF (very high frequency) and UHF (ultra high frequency), and more particularly to a high-frequency AGC circuit having a constant impedance characteristics and a broad controllable gain range at a high gain level.

Conventionally, two kinds of AGC circuits have have been used for the VHF and UHF frequency ranges, namely: the so-called "variable emitter current type AGC circuit" which controls an amplifier gain by regulating the current transfer factor of a transistor through varying the bias current of the transistor; and an AGC circuit for an amplifier having two cascaded amplifying stages and a variable attenuator, which attenuator is formed of a diode connected between the two amplifying stages and a load resistor or a terminating resistor, whereby the gain of the amplifier is controlled by regulating the attenuation of said attenuator through changing the equivalent resistance of the aforesaid diode by modifying its forward bias current.

The variable emitter current type AGC circuit has a shortcoming in that, when the emitter current is varied in excess of a certain limit, the amplifier output is considerably distorted because the high-frequency amplification of the transistor depends on the emitter current, so that even a signal of comparatively low level generates higher harmonics components, which harmonics generation prohibits the use of the AGC circuit at a high signal level and restricts the variable gain to a comparatively narrow range. The conventional AGC circuit using the attenuator has the shortcomings that non-linear portions of various operative characteristics of the attenuator diode tend to cause harmonics distortion and deterioration of the overall amplifying characteristics of the amplifier, that there are certain limitations on the bias current, and that the resistance loss within the diode is not negligible even when the equivalent resistance of the diode is at its minimum.

With the aforesaid conventional AGC circuits, input and/or output impedance of the amplifier changes as the gain or attenuation level of the amplifier varies, so that signal reflection may be caused at the boundaries between the amplifier and outside circuits connected to its input and output terminals. To eliminate such reflection, buffer circuits are often used at the input and output sides of the amplifier.

SUMMARY OF THE INVENTION

Therefore, an object of the present invention is to obviate the aforesaid difficulties of the conventional AGC circuits, by utilizing a hybrid negative feedback at the input stage of an amplifier and a series negative feedback at the output stage thereof.

The above and other objects are attained by a high-frequency automatic gain control circuit for a common emitter earthed amplifier wherein a hybrid negative feedback is applied to an input stage thereof from the emitter of an output stage transistor through a hybrid transformer connected to the base of an input stage transistor and a series negative feedback is applied to the output stage thereof, characterized in that a diode which is shunted by a capacitor is connected in series to an emitter resistor of the output stage transistor, and that an automatic gain control signal is applied to said diode for regulating the gain of said amplifier by controlling negative feedback ratio of said negative feedback.

BRIEF DESCRIPTION OF THE DRAWINGS

The invention will now be described in detail by referring to the accompanying drawing, wherein.

PREFERRED EMBODIMENTS OF THE PRESENT INVENTION

Figure 1:
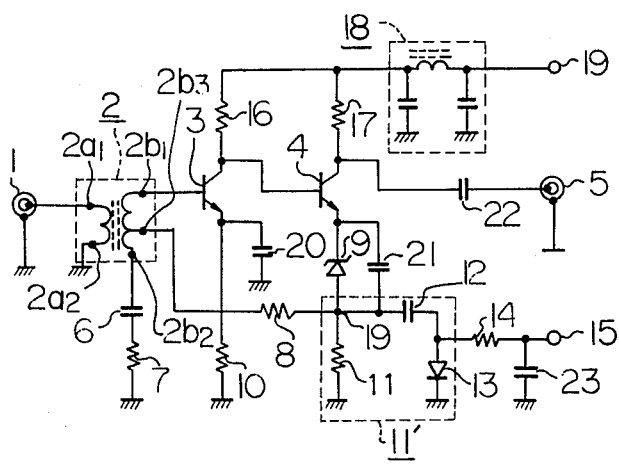
FIG. 1 is a circuit diagram of an embodiment of the present invention.

FIG. 1 illustrates a circuit diagram of a high-frequency AGC circuit according to the present invention. In the figure, the reference numeral 1 represents an input terminal, 2 represents a hybrid transformer, 3 represents an input stage transistor, 4 represents an output stage transistor, and 5 represents an output terminal. The hybrid transformer 2 includes a primary coil $2a$, which has one end thereof $2a_1$ connected to the input terminal 1 and the other end thereof $2a_2$ grounded. The hybrid transformer 2 also includes a secondary coil $2b$, which has one end thereof $2b_1$ connected to the base of the transistor 3, the other end $2b_2$ grounded through a capacitor 6 and a matching resistor 7 connected in series thereto, and the middle point thereof $2b_3$ connected to the emitter of the transistor 4 through a feedback resistor 8 and a D.C. shift diode 9. The reference numeral 10 is an emitter resistor for the transistor 3, and 11 is an emitter resistor for the transistor 4. Thus, the two transistors 3 and 4 form a common emitter two-stage amplifier, in which the collector of the transistor 3 is directly connected to the base of the transistor 4. The emitter resistor 11 for the transistor 4 is connected to a control diode 13 through a capacitor 12, so that a synthetic impedance $11'$ is formed by the resistor 11, the capacitor 12, and the diode 13. The anode of the diode 13 is connected to an AGC signal input terminal 15 through a bias resistor 14, and the cathode of the diode 13 is directly grounded. The reference numeral 16 shows a collector resistor for the transistor 3, 17 shows a collector resistor for the transistor 4, 18 shows a smoothing circuit for power source, and 19 shows a power source terminal. The numeral 20 designates an emitter bypass capacitor for the transistor 3, 21 designates a shunt capacitor connected across the diode 9, 22 designates a D.C. blocking capacitor, and 23 designates a bypass capacitor for the AGC signal input terminal 15.

Figure 2:
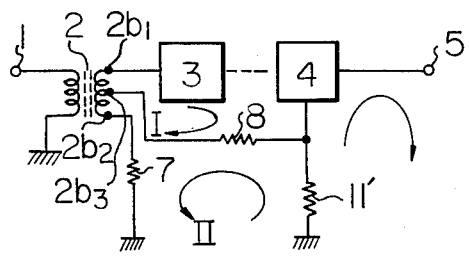
FIG. 2 is a simplified version of the circuit of FIG. 1.

FIG. 2 illustrates the operative principle of the AGC circuit according to the present invention, by simplifying the detailed circuit of FIG. 1, In FIG. 2 two feedback loops act as hybrid negative feedback circuits for the input stage: namely, a first negative feedback loop I which traces from the secondary coil end $2b_1$ through the transistor 3, the transistor 4, the resistor 8, and the secondary coil middle point $2b_3$, back to the secondary coil end $2b_1$; and a second negative feedback loop II which traces from the hybrid transformer secondary coil end $2b_2$, through the resistor 7, the ground, the synthetic impedance 11', the resistor 8, and the secondary coil middle point $2b_3$, and back to the coil end $2b_2$. A series negative feedback acts on an output stage which includes a path tracing from the transistor 4, through the output terminal 5 and the synthetic impedance 11', and back to the transistor 4.

Referring again to FIG. 1, let it be assumed that no AGC signal is supplied to the AGC signal input terminal 15. Without the AGC signal, the equivalent resistance of the diode 13 is so large that the impedance of the synthetic impedance 11' is substantially the same as the resistance value of the resistor 11. Under such conditions, the feedback ratio of each of the first and second feedback loops, which depends on the resistance values of the resistors 8 and 11 and the impedance value as seen from the hybrid transformer secondary coil middle point $2_3$, is large, and the gain of the amplifier consisting of the transistors 3 and 4 is set to be the minimum in the controllable range of the AGC circuit. At the same time, the local feedback ratio for the transistor 4 is large, so that the amplification factor of the transistor 4 is controlled to be small.

Let it now be assumed that an AGC signal is applied to the AGC signal input terminal 15, so as to cause an electric current to flow through the diode 13. In this case, the equivalent resistance of the diode 13 is so reduced that the impedance value of the synthetic impedance 11' becomes small, and the feedback ratio of each negative feedback loop is so reduced as to raise the gain of the amplifier. Under such conditions, the local negative feedback ratio for the transistor 4 is also reduced, so that the amplification factor of the transistor 4 is controlled to be large. More particularly, as shown in FIG. 2, a negative feedback signal generated in the synthetic impedance 11' acts in three ways: namely, as a local negative feedback to the transistor 4; as a series negative feedback to the output stage through the path tracing from the transistor 4, through the output terminal 5 and the synthetic impedance 11', and back to the transistor 4, and; as a hybrid negative feedback to the two negative feedback loops for the input stage through the resistor 8.

With a negative feedback amplifier, its input and output impedances depend on the type of the negative feedback used. If the amplification factor of the negative feedback loop is represented by $\mu$ and its feedback ratio is represented by $\beta$, the input and output impedances of the amplifier are multiplied by a factor of $1/(1-\mu\beta)$ in the case of parallel negative feedback, and by a factor of $(1-\mu\beta)$ in the case of series negative feedback. With the hybrid negative feedback for the amplifier input stage according to the present invention, a feedback action which is applied to the point receiving the feedback signal becomes intermediate between that of the parallel negative feedback and that of the series negative feedback. Thus, the so-called bridge feedback is effected, and if the bridge circuit is kept balanced, the input circuit and the $\beta$ circuit become conjugate with each other, so that the input impedance is maintained constant. In the output stage to which the series negative feedback is applied, the internal impedance value as seen from the collector of the transistor 4 is changed by being multiplied by a factor of $(1-\mu\beta)$, e.g., to an impedance value of several hundreds of ohms or more, but the impedance values of other systems which are connected to the amplifier of this type are comparatively small, e.g., 50 ohms to 75 ohms, so that the aforesaid impedance value (several hundreds of ohms or more) can be neglected. With the illustrated embodiment of the invention, the resistance value of the collector resistor 17 for the transistor 4 is so set as to match the load impedance, so that the output impedance is determined by this resistance value.

Figure 3:
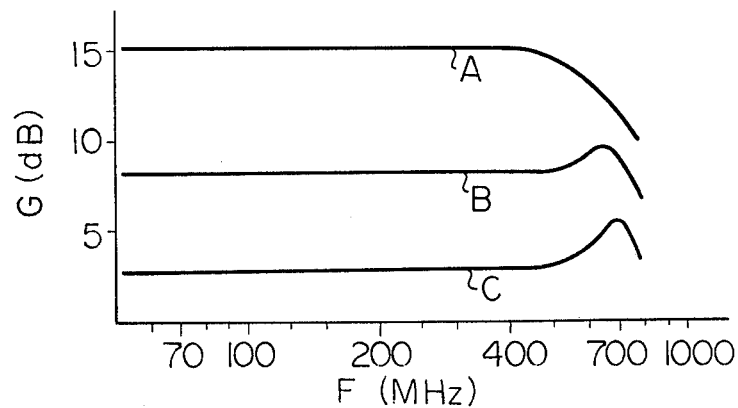
FIG. 3 is a graph showing the frequency characteristics of the embodiment.
Figure 4:
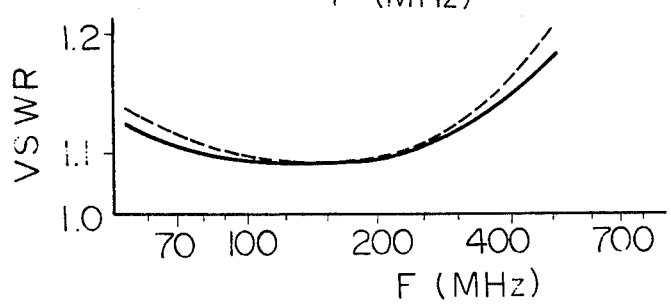
FIG. 4 is a graph showing the input impedance characteristics of the embodiment.
Figure 5:
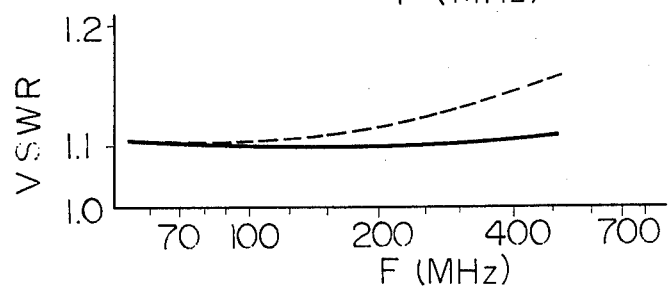
FIG. 5 is a graph showing the output impedance characteristics of the embodiment.

FIGS. 3 through 5 show the operative characteristics of the illustrated embodiment. Various constants relating to the embodiment of FIG. 1 were as follows: namely, the cut-off frequency $f_T$ of the transistors 3 and 4 was 4.5 GHz; the frequency band of the amplifier was 50 MHz to 500 MHz; the noise figure was 7 to 8 dB; the differential gain characteristic was less then 1% for 140±20 MHz; the delay characteristic was less than 1 nS for 140±20 MHz; the output impedance was 50 ohms; the maximum output was 8dBm; the variable range of the gain was 3 to 15 dB, and; the synthetic impedance 11' was set in the range of 36 to 800 ohms.

FIG. 3 shows the frequency characteristics when an AGC signal is applied to the AGC signal input terminal 15, wherein the horizontal axis shows the frequency F in MHz and the vertical axis shows the gain G in (dB), and the curves A, B, and C represent the characteristics for the AGC signal voltages of 1 volt, 0.55 volt, and 0.2 volt, respectively. The peaks in the characteristics at high frequencies are due to the phase rotation in the negative feedback loops.

FIG. 4 illustrates the input impedance characteristics, and FIG. 5 illustrates the output impedance characteristics, wherein the horizontal axis shows the frequency F in MHz and the vertical axis shows the voltage standing wave ratice VSWR. The solid line curves in FIGS. 4 and 5 represent the characteristics for the voltage gain of 3 dB, and the dotted line curves represent those for the voltage gain of 15 dB. As is apparent from the figures, highly satisfactory input and output impedance characteristics were obtained.

The diode 13 to be used in the AGC circuit according to the present invention is preferably such that its equivalent resistance varies linearly as the AGC signal applied thereto changes and its reactance variation is small. For instance, a PIN diode is suitable for use as the diode 13.

As is apparent from the foregoing disclosure, according to the present invention, a high-frequency AGC circuit with excellent operative characteristics can be achieved with a comparatively simple circuit construction, which AGC circuit is particularly useful for transmission equipment and the like.

From the foregoing, it will now be apparent that a new and improved AGC circuit has been found. It should be understood of course that the embodiments disclosed are only illustrative and are not intended to limit the scope of the invention. Reference should be made to the appended claims, therefore, as indicating the scope of the invention.

What is claimed is:

1. A high-frequency automatic gain control circuit for an emitter earthed amplifier wherein a hybrid negative feedback is applied to an input stage thereof from the emitter of an output stage transistor through a hybrid circuit connected to the base of an input stage transistor and a series negative feedback is applied to the output stage thereof, characterized in that a series connection of a diode and a capacitor is connected in shunt with an emitter resistor of the output stage transistor, and that an automatic gain control signal is applied to said diode between said diode and said capacitor for regulating the gain of said amplifier by controlling the negative feedback ratio of said negative feedback.

2. A high-frequency automatic gain control circuit according to claim 1, wherein said diode is a PIN diode.

3. A high-frequency automatic gain control circuit according to claim 1, wherein the collector of the input stage transistor is connected directly to the base of the output stage transistor.

* * * * *